(12) United States Patent
Yang et al.

(10) Patent No.: US 10,141,934 B2
(45) Date of Patent: Nov. 27, 2018

(54) HIGH SPEED LEVEL-SHIFTER

(71) Applicant: Taiwan Semiconductor Manufacturing Co., Ltd., Hsin-Chu (TW)

(72) Inventors: Yu-Tao Yang, Zhubei (TW); Wen-Shen Chou, Zhubei (TW); Yung-Chow Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/794,331

(22) Filed: Oct. 26, 2017

(65) Prior Publication Data

US 2018/0152187 A1 May 31, 2018

Related U.S. Application Data

(60) Provisional application No. 62/427,555, filed on Nov. 29, 2016.

(51) Int. Cl.
*H03K 19/017* (2006.01)
*H01L 27/02* (2006.01)
*H01L 27/092* (2006.01)
*H01L 29/06* (2006.01)
*H03K 19/0185* (2006.01)

(52) U.S. Cl.
CPC ... *H03K 19/01721* (2013.01); *H01L 27/0207* (2013.01); *H01L 27/092* (2013.01); *H01L 29/0619* (2013.01); *H03K 19/018521* (2013.01)

(58) Field of Classification Search
CPC ...... H03K 19/01721; H03K 19/018521; H01L 27/0207; H01L 27/092; H01L 29/0619
USPC .............................................. 326/81, 68, 75
See application file for complete search history.

(56) References Cited

U.S. PATENT DOCUMENTS

| | | | | |
|---|---|---|---|---|
| 5,969,542 | A * | 10/1999 | Maley | H03K 3/012 326/17 |
| 8,368,425 | B2 * | 2/2013 | Huang | H03K 3/356182 326/68 |
| 2003/0042965 | A1 * | 3/2003 | Kanno | H03K 3/356113 327/333 |
| 2010/0109705 | A1 * | 5/2010 | Pamperin | H03K 3/356113 326/68 |

* cited by examiner

*Primary Examiner* — Daniel D Chang
(74) *Attorney, Agent, or Firm* — Duane Morris LLP

(57) ABSTRACT

A level shifter circuit includes a latch module with a first plurality of PMOS transistors and a second plurality of NMOS transistors; a MOS module with a third plurality of MOS transistors operatively connected to the latch module; a fourth plurality of transistors operatively connected between the MOS module and the ground; and a fifth plurality of capacitors operatively connected between the latch module and the gates of fourth plurality of transistors.

20 Claims, 12 Drawing Sheets

HIGH SPEED LEVEL-SHIFTER

CROSS-REFERENCE TO RELATED APPLICATION

The present application claims priority to U.S. Provisional Patent Application No. 62/427,555, filed on Nov. 29, 2016, which is incorporated by reference herein in its entirety.

BACKGROUND

A level shifter is an electronic device that converts digital signals from one logic level to another logic level. In digital circuits, a logic level is one of a finite number of states that a digital signal can have. Logic levels are usually represented by the voltage difference between the signal and ground. A digital-to-analog converter (DAC) is a system that converts a digital signal into an analog signal. The level shifter is a critical component for high speed DAC operations.

Conventional level shifters have a DC static current which results in large power consumption. Due to hot carrier injection, the conventional level shifters suffer from reliability problems because overshot current causes premature degradation of the integrated circuit. As a result, the life time of the circuit is reduced. Hot carrier injection (HCI) is a phenomenon in solid-state electronic devices where an electron or a "hole" gains sufficient kinetic energy to overcome a potential barrier necessary to break an interface state. The term "hot" refers to the effective temperature used to model carrier density. Since the charge carriers can become trapped in the gate dielectric of a MOS transistor, the switching characteristics of the transistor can be permanently changed. Hot-carrier injection is one of the mechanisms that adversely affects the reliability of semiconductors of solid-state devices.

Advanced DAC designs require operations to be performed at high speeds (e.g., higher than 18 GHz), which cannot be achieved by conventional level shifter designs. In addition to high speed performance, advanced DAC designs require low power and reliable level shifters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

Figure 1:
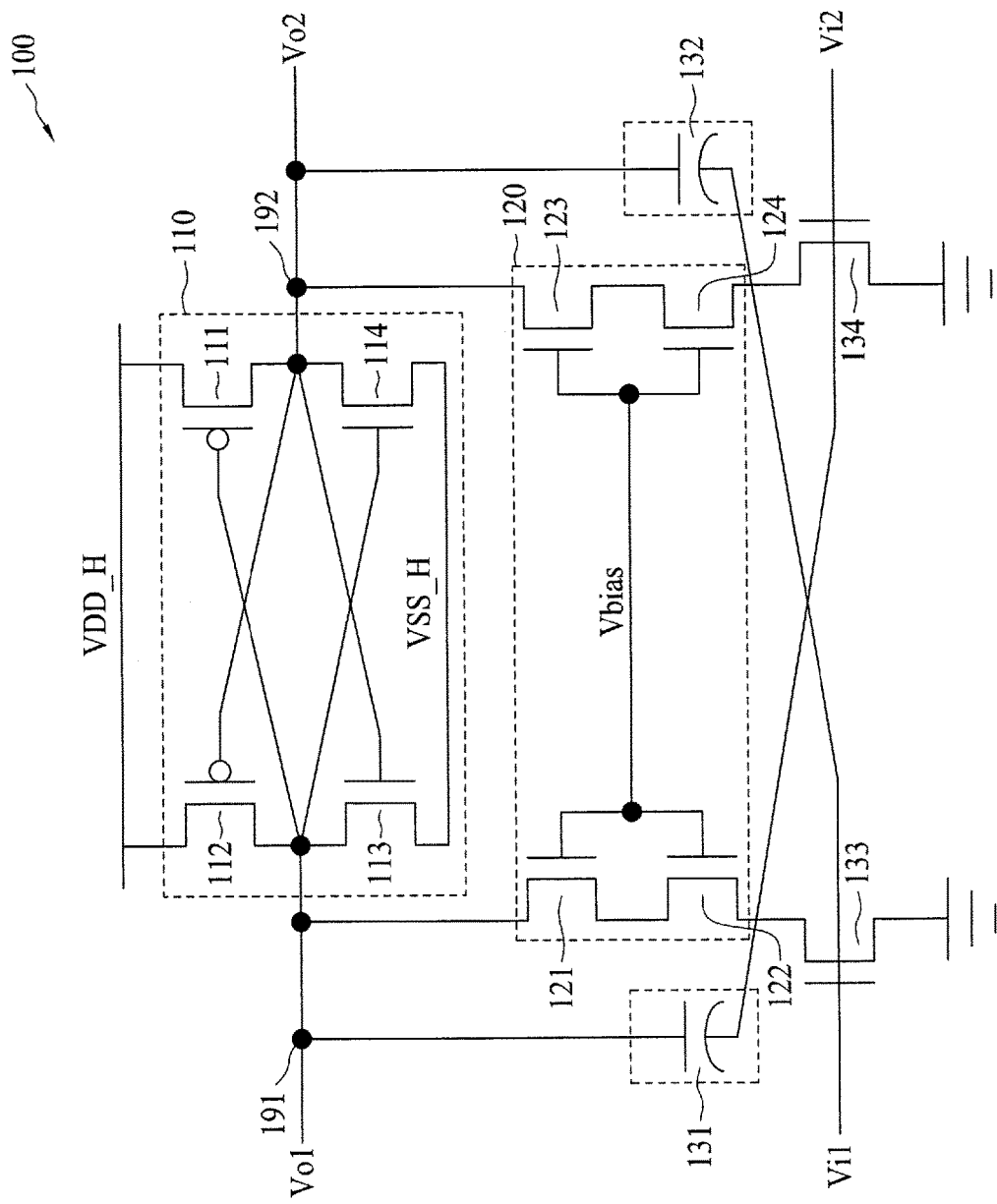
FIG. 1 is a schematic illustration of a level shifter circuit design, in accordance with some embodiments.

The following disclosure provides various embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic illustration of a level shifter circuit 100, in accordance with some embodiments. The level shifter circuit 100 includes a latch module 110, a serial NMOS (N-type metal-oxide-semiconductor) module 120, two AC coupling capacitors 131, 132, and two NMOS transistors 133, 134. The latch module 110 includes two PMOS (P-type metal-oxide-semiconductor) transistors 111 and 112, and two NMOS transistors 113 and 114, in accordance with some embodiments. The sources of the PMOS transistors 111 and 112 are electrically connected to $V_{DD\_H}$, the drains of the PMOS transistors 111 and 112 are electrically connected to the sources of the NMOS transistors 114 and 113 respectively, which are further connected to output nodes $V_o2$ and $V_o1$ respectively. The drains of the NMOS transistors 114 and 113 are electrically connected to $V_{SS\_H}$. The gate of PMOS transistor 112 is electrically connected to $V_o2$, the gate of the PMOS transistor 111 is electrically connected to $V_o1$, the gate of NMOS transistor 113 is electrically connected to $V_o2$, and the gate of the NMOS transistor 114 is electrically connected to $V_o1$. According to some embodiments, the latch module 110 is implemented to improve speed of the level shifter and DAC.

According to some embodiments, the serial MOS module 120 includes four NMOS transistors 121, 122, 123 and 124. The source of the NMOS transistor 121 is electrically connected to $V_o1$ and the source of the NMOS transistor 123 is electrically connected to $V_o2$. The sources of NMOS transistor 122 and 124 are electrically connected to the drains of the NMOS transistors 121 and 123 respectively. The gates of NMOS transistors 121, 122, 123, and 124 are all electrically connected to $V_{bias}$. The drains of NMOS transistors 122 and 124 are electrically connected to the sources of NMOS transistors 133 and 134 respectively, and the drains of the NMOS transistors 133 and 134 are grounded. According to some embodiments, the serial MOS module 120 is implemented for power saving and reliability improvement.

According to some embodiments, one end of a first AC coupling capacitor 131 is electrically connected to $V_o1$, and the other end is electrically connected to the gate of NMOS transistor 134, which is further connected to $V_i2$. Similarly, one end of a second AC coupling capacitor 132 is electrically connected to $V_o2$, and the other end is electrically connected to the gate of NMOS transistor 133, which is further connected to $V_i1$. According to some embodiments, the implementation of AC coupling capacitors 131, 132 across the input and the output improves the speed of the level shifter and the DAC.

Figure 2A:
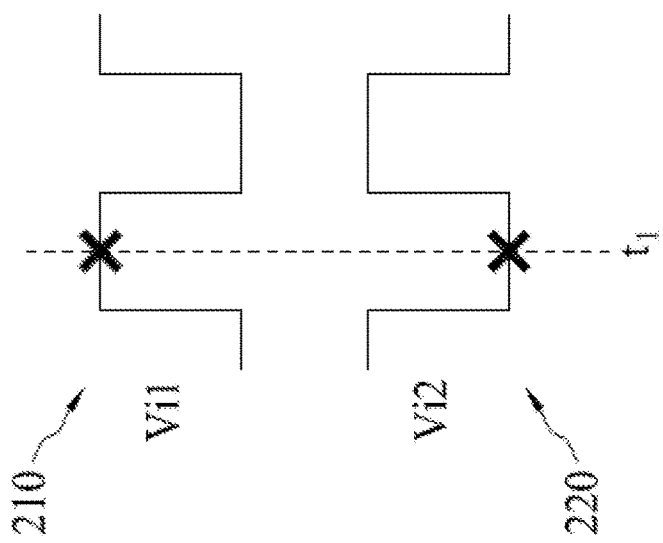
FIGS. 2A and 2B are schematic illustrations of a level shifter circuit operating under a DC condition, in accordance with some embodiments.
Figure 2B:
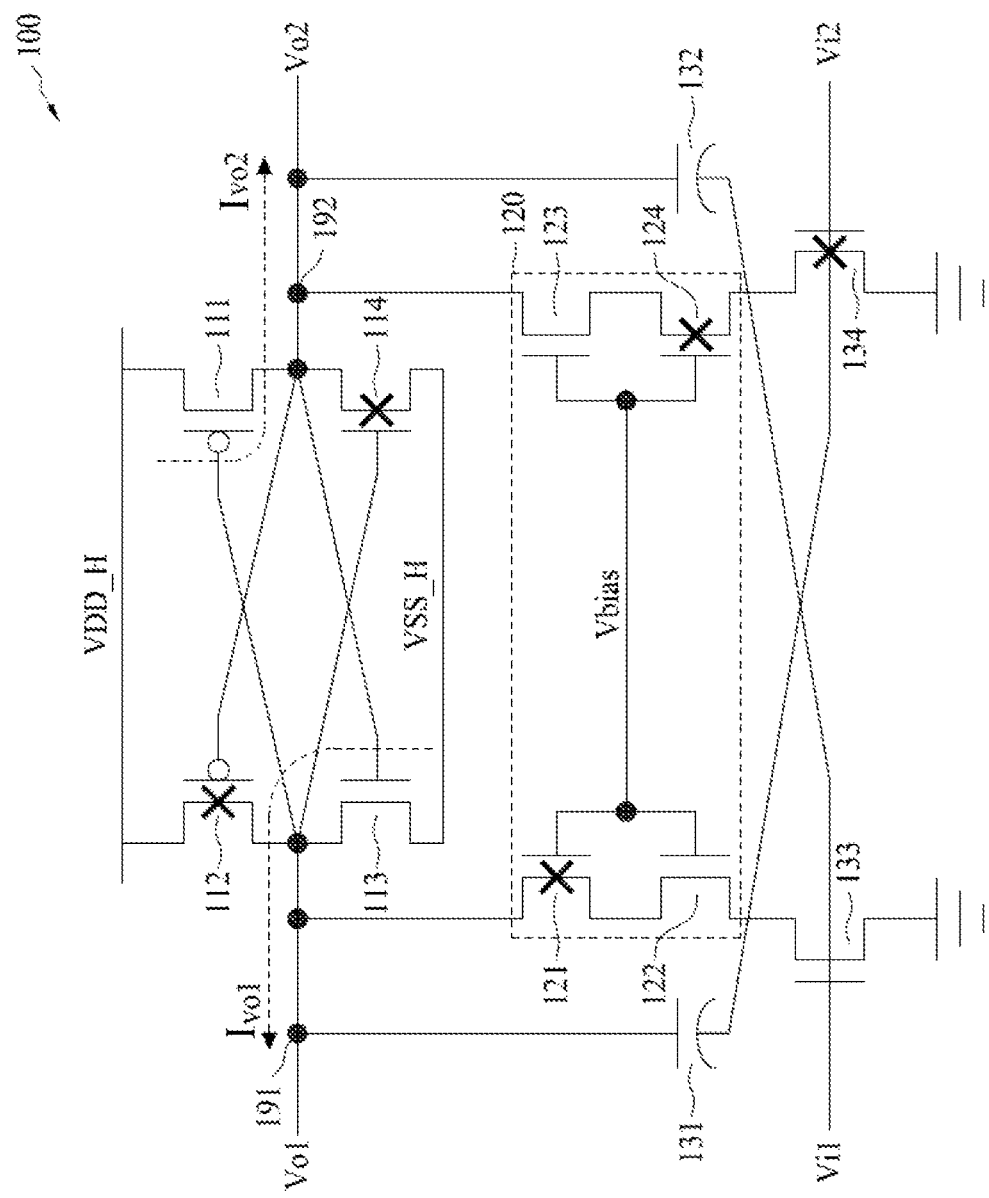

FIGS. 2A and 2B are schematic illustrations of the waveforms of the level shifter circuit 100 operating under DC conditions, in accordance with some embodiments. As used herein, "DC condition" refers to a condition when the circuit is not transitioning from one logic state into another logic state. According to some embodiments, under DC conditions, at time $t_1$, the $V_i1$ waveform is illustrated as 210 and the $V_i2$ waveform is illustrated as 220. As illustrated at time $t_1$, $V_i1$ is at logic high and $V_i2$ is at logic low, while both $V_i1$ and $V_i2$ are under a DC condition, the level shifter circuit 100 is in a stable condition. Additionally, the NMOS transistor 133 is turned on, and the NMOS transistor 134 is turned off. Under the stable DC condition, because the gate of the NMOS transistor 133 is connected to node 192 through the AC coupling capacitor 132, the PMOS transistor 112 is turned off (as indicated by a symbol "X"), the NMOS transistor 113 is turned on. As $V_{i1}$ rises and $V_{i2}$ drops, at time $t_1$ in FIG. 2A, the current $I_{vo1}$ increases to first switch off the transistor 121, and then switches off the transistor 122; at the same time, the current $I_{vo2}$ increases to first switch off the transistor 124, and then transistor 123. When a stable state is reached, all four transistors 121, 122, 123 and 124 are switched off. Another AC coupling capacitor 131 connects the gate of the NMOS transistor 134 and the node 191. Additionally, NMOS transistor 134 is turned off, the PMOS transistor 111 is turned on, the NMOS transistor 114 is turned off. As a result, the $V_o1$ is locked to the voltage of VSS_H by the NMOS transistor 113 through current $I_{vo1}$, and $V_o2$ is locked to the voltage of VDD_H by the PMOS transistor 111 through current $I_{VO2}$. Due to the existence of the MOS module 120, when the NMOS transistor 121 is turned off as illustrated in FIG. 2, the static current discharge path between $V_o1$ and ground is cut off and as a result there is no static current flowing to the ground through NMOS transistor 133. Similarly, when the NMOS transistor 124 is turned off, the voltage VA, which is the voltage between the NMOS transistors 124 and 134, is limited to the difference between $V_{bias}$ and the threshold voltage of the NMOS transistor 124 ($V_{th\_124}$), which is $V_{bias}-V_{th\_124}$. The absence of static current reduces power consumption of the level shifter circuit and improves reliability by preventing overshot current.

Figure 3:
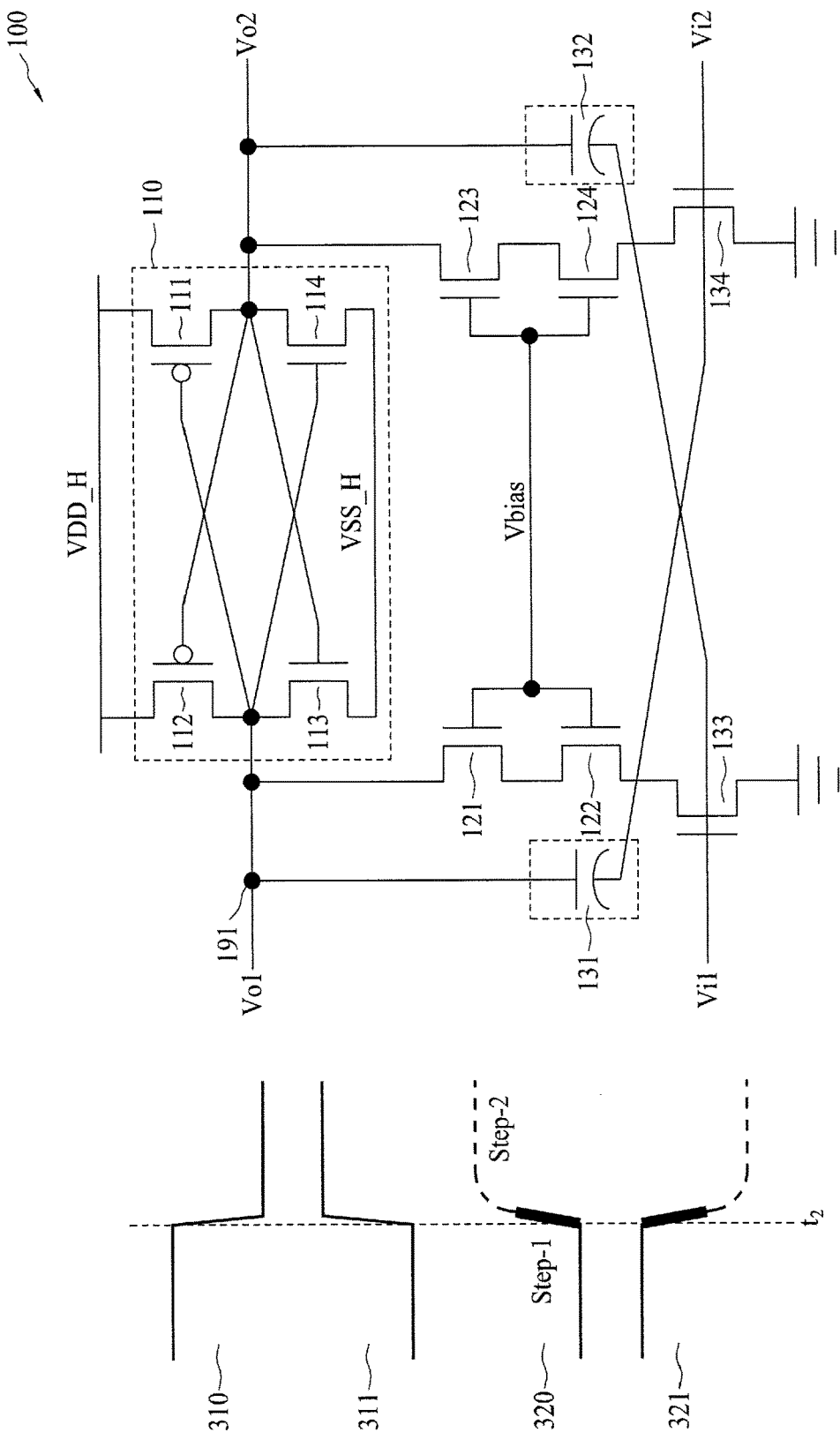
FIG. 3 is a schematic illustration of the waveforms of a level shifter circuit operating under an input switch condition, in accordance with some embodiments.

FIG. 3 is a schematic illustration of the waveforms of the level shifter circuit 100 operating under an input switch condition, in accordance with some embodiments. As used herein, an "input switch condition" refers to a condition when the circuit is changing from one logic state to a different logic state. The circuit 100 is under an input switching condition at time $t_2$, the input waveforms are illustrated as 310 and 311, and the output waveforms are illustrated as 320 and 321. During this switching, there are two steps. The first step, Step 1, is a rapid pull-up stage for $V_o1$, and rapid pull-down stage for $V_o2$; the second step, Step 2, is a steady state stage when both $V_o1$ and $V_o2$ are in a steady state condition. The rapid pull-up and pull-down are achieved by the implementation of AC coupling capacitors 131 and 132 respectively in FIG. 2B. The output current $I_{vo1}$ is rapidly coupled to the input voltage $V_{i2}$, and the output current $I_{vo2}$ is rapidly coupled to the input voltage $V_{i1}$. The existence of the coupling capacitors 131 and 132 in the level shifter circuit allow for the rapid pull-up and pull down because sufficient charges are held by the coupling capacitors 131 and 132 prior to the process of pulling-up and pulling-down. After the charging and discharging of the AC coupling capacitors 131 and 132, the steady state stage is achieved through the latch module 110. In the steady state stage, $V_o1$ and $V_o2$ are locked to the voltages of $V_{SS\_H}$ and $V_{DD\_H}$ respectively. According to some embodiments, the achieved output frequency of the level shifter (i.e., how fast the output levels change from a first state to a second state) is above 33 GHz.

Figure 4A:
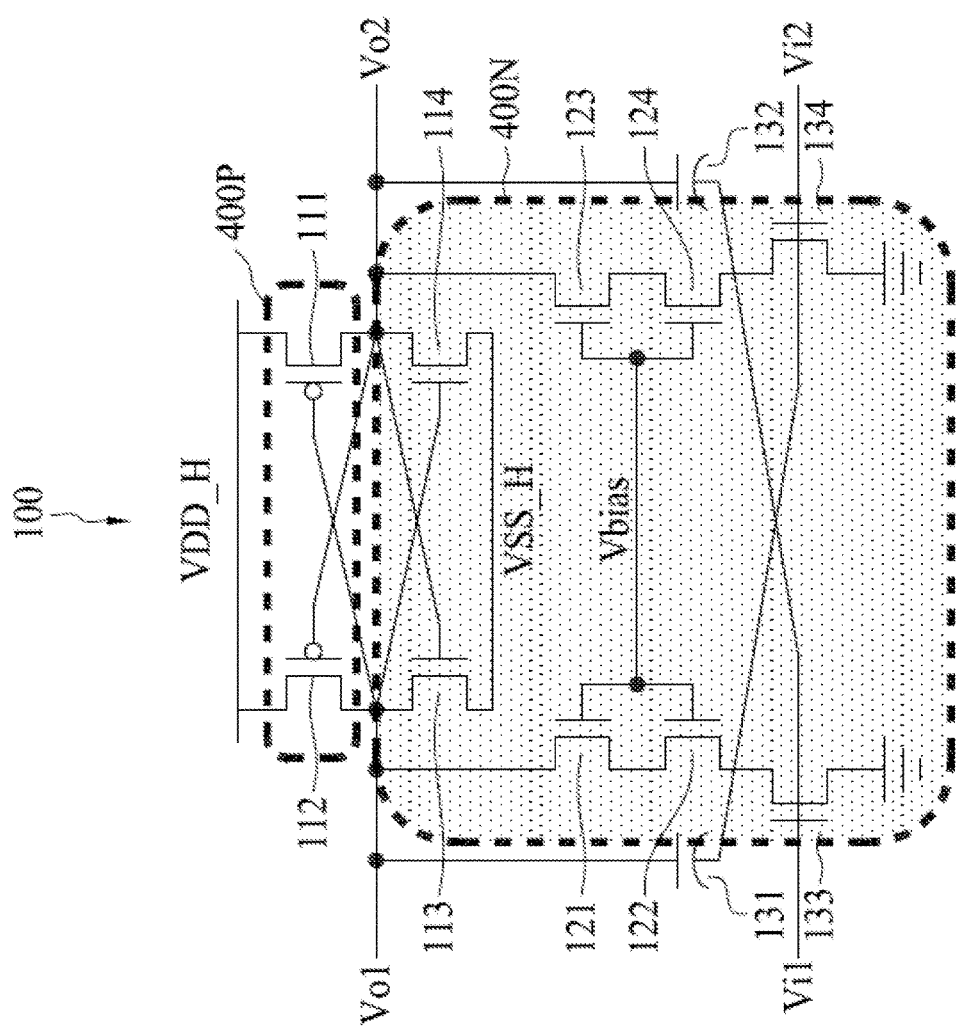
FIGS. 4A and 4B are schematic illustration of a layout design of a level shifter circuit, in accordance with some embodiments.
Figure 4B:
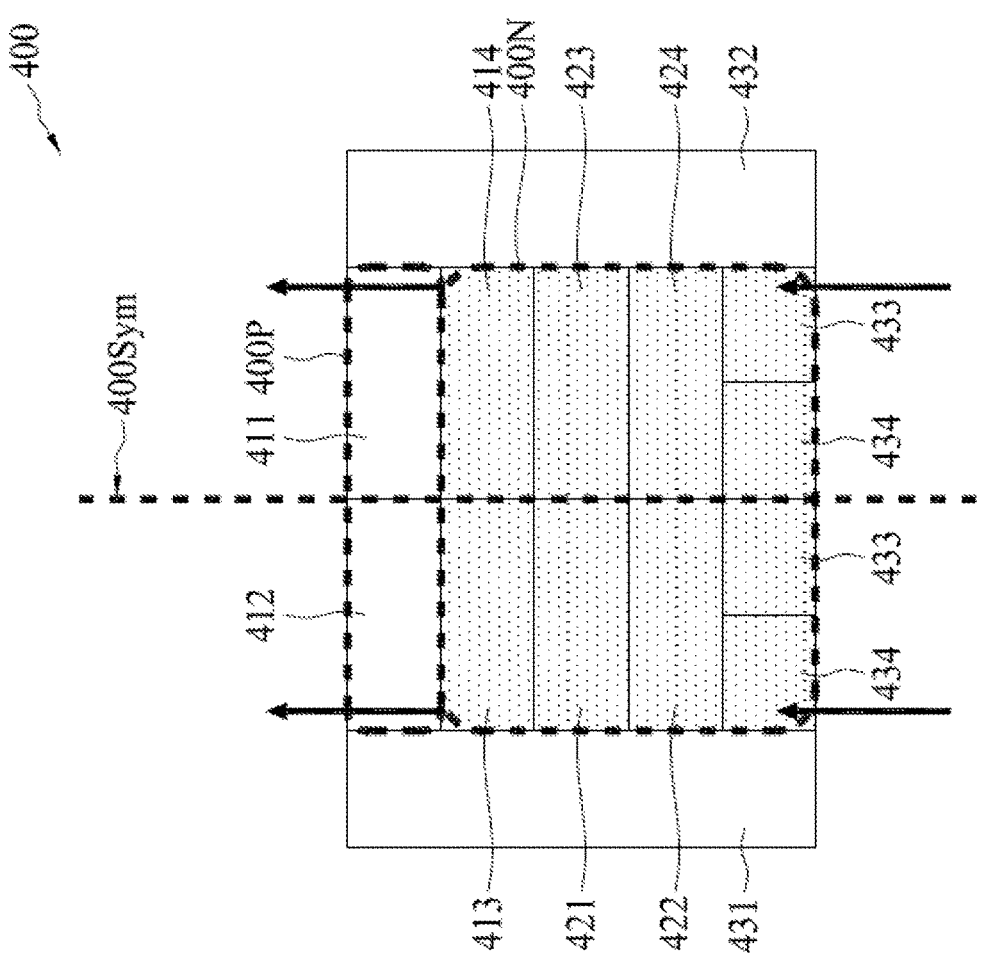

FIGS. 4A and 4B are schematic illustrations of the layout design of the level shifter circuit 100 implemented on a substrate, in accordance with some embodiments. On the left side of FIG. 4 is the schematic diagram of the level shifter circuit 100 as illustrated in FIGS. 1-3, all PMOS transistors 111, 112 are within a PMOS guard ring 400P, and all NMOS transistors 113, 114, 121, 122, 123, 124, 133, 134 are within an NMOS guard ring 400N. As used herein, a "guard ring" refers to a structure used to protect high impedance nodes in an integrated circuit from surface leakage currents. The guard ring is typically a ring of copper driven by a low-impedance source to the same voltage as the high impedance node. The AC coupling capacitors 131 and 132 are not within the guard rings, in accordance with some embodiments. According to some embodiments, FIG. 4B is the corresponding layout placement 400 for the level shifter circuit 100 shown in FIG. 4A. The PMOS guard ring 400P is placed to include all PMOS transistors 411, 412 as discussed above, and the NMOS guard ring 400N is placed to include all NMOS transistors 413, 414, 421, 422, 423, 424, 433, 434 as discussed above. The transistor 413 corresponds to the transistor 113 in FIG. 4A, the transistor 421 corresponds to 121 in FIG. 4A, the transistor 422 corresponds to 122 in FIG. 4A, the transistor 414 corresponds to 114 in FIG. 4A, the transistor 423 corresponds to 123 in FIG. 4A, the transistor 424 corresponds to 124 in FIG. 4A. The AC coupling capacitors 431 and 432 are placed outside the guard rings. According to some embodiments, all devices are placed on a substrate symmetrically relative to the line of symmetry 400SYM, which is defined on the surface of the substrate. For example, the cell 412 represents PMOS transistor device 112 and the cell 411 represents PMOS transistor device 111. According to the discussion above, cells 411 and 412 are placed symmetrically relative to the line of symmetry 400SYM. According to some embodiments, the symmetric layout placement cancels symmetric offset by parasitic current. The placement of transistors 433 and 434 are interleaved, which will be discussed in more detail below. According to some embodiments, area optimization is achieved by grouping same N/P type devices together within one guard ring, for example, transistors 413, 414, 421, 422, 423 and 424 are grouped within the same guarding ring to achieve area optimization. According to some embodiments, speed is improved by reducing the cell impedance inside the guard ring by placing capacitors outside the guard rings. According to some embodiments, the capacitor 431 is electrically connected to transistors 411, 412, 413, 414, 421 and 434, while the capacitor 432 is electrically connected to the transistors 411, 412, 413, 414, 423 and 433 as illustrated in the schematic circuit diagram of FIG. 4. Similarly, the capacitor 432 is connected to the transistors 411, 414 and 433 as illustrated in the schematic circuit diagram of FIG. 4. According to some embodiments, the capacitors 431 and 432 are coupled across the input and output to minimize parasite current in the routing path, which improves the overall speed of the level shifter.

Figure 5A:
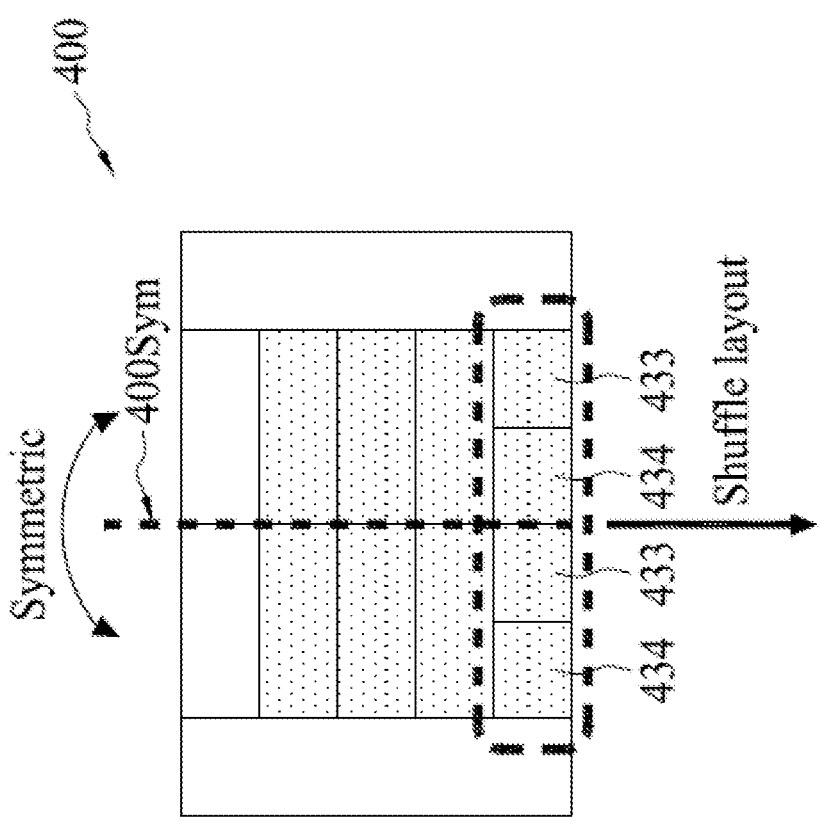
FIGS. 5A and 5B are schematic illustrations of a layout design of a level shifter circuit, in accordance with alternative embodiments.
Figure 5B:
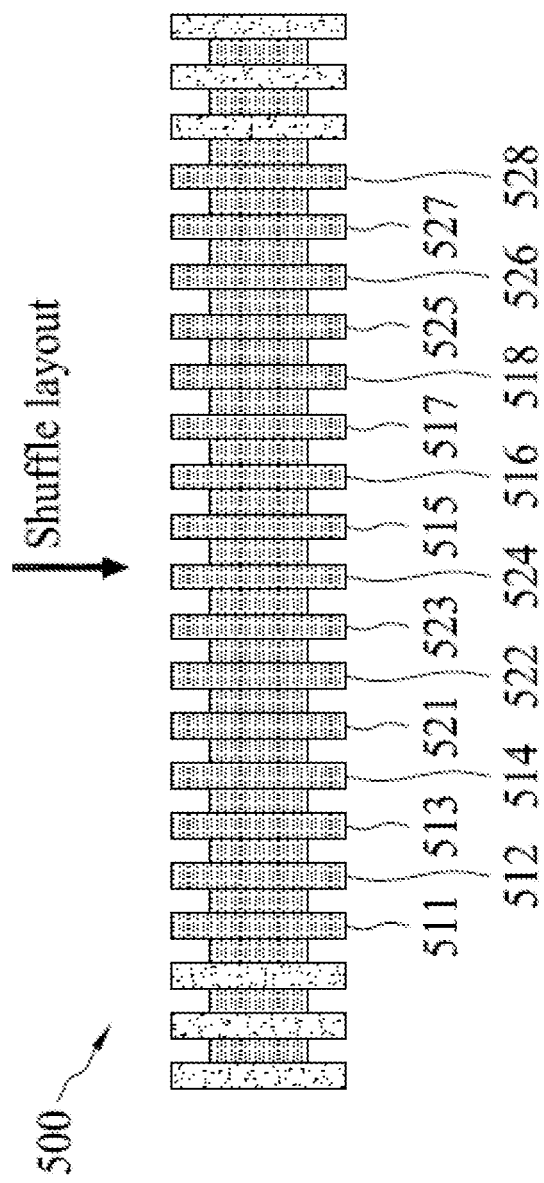

FIGS. 5A and 5B are schematic illustrations of the layout design of the level shifter circuit 100, in accordance with some embodiments. According to some embodiments, the transistors 433 and 434 are placed in a shuffle layout. According to some embodiments, a shuffle layout is a layout in which the transistors are interleaved, for example, the strips 511-518 belong to transistor 433, and the strips 521-529 belong to transistor 434. Each strip is sometimes called a "finger" in this context. There are different arrangements for interleaved shuffle layout, for example, every two fingers of transistor 433 may be interleaved with every two fingers of transistor 434. Alternatively, every four fingers of transistor 433 may be interleaved with every four fingers of transistor 434, as shown in the example of FIG. 5. According to some embodiments, dummy fingers (or D fingers) are inserted to reduce mismatch introduced by the density gradient effect. In order to reduce manufacturing variation due to chemical-mechanical polishing, and in order to improve yield, layout must be made uniform with respect to density criteria. This is achieved by layout post processing to add fill geometries, either at the foundry, or for better convergence of performance variation flows, during layout synthesis.

The design rules include rules regarding acceptable density gradients within sensitive regions or within other regions, acceptable density gradients between sensitive regions and surrounding regions or other adjacent regions or between other regions in the design layout. According to some embodiments, the design rules also include acceptable ranges for device feature densities in adjacent windows or for acceptable ranges for average densities in adjacent device regions. According to some embodiments, design rules regarding acceptable disparities between device feature densities of adjacent or other device regions or between a device region and a surrounding region are also implemented. According to some embodiments, a shuffle layout reduces the mismatch which is induced by the density gradient effect (DGE), as discussed in further detail below.

Design for manufacturing (DFM) refers to actions taken during the physical design stage of IC development to ensure that the design is capable of being accurately manufactured. Chemical-mechanical polishing (CMP) hotspot analysis inspects areas of the design that have a higher than average possibility of experiencing defects due to CMP. Because different materials exhibit different erosion rates under the CMP process, it is important to maintain a density balance across the die to prevent bumps and dishing that cause shorts and opens in the metal interconnects. CMP analysis measures various aspects of the layout to ensure even planarity as the IC chip is built up over multiple layers. Typical measurements include maximum and minimum metal (copper) density, density gradient over a defined window, density variation across the die, and the total perimeter of polygons within a window.

According to some embodiments, the design rules include rules regarding acceptable density gradients within sensitive regions or within other regions, acceptable density gradients between sensitive regions and surrounding regions or other adjacent regions or between other regions in the design layout. According to some embodiments, the design rules also include acceptable ranges for device feature densities in adjacent windows or for acceptable ranges for average densities in adjacent device regions. Design rules regarding acceptable disparities between device feature densities of adjacent or other device regions or between a device region and a surrounding region are also used in some exemplary embodiments.

According to some embodiments, a differential pair is two complementary transmission lines that transfer equal and opposite signals. Maintaining the equal and opposite amplitude and timing relationship is the principal concept when implementing differential pairs. According to some embodiments, the shuffle layout is an implementation of differential pairs. According to some embodiments, symmetry is the key factor in deploying differential signals in high-speed designs.

Figure 6A:
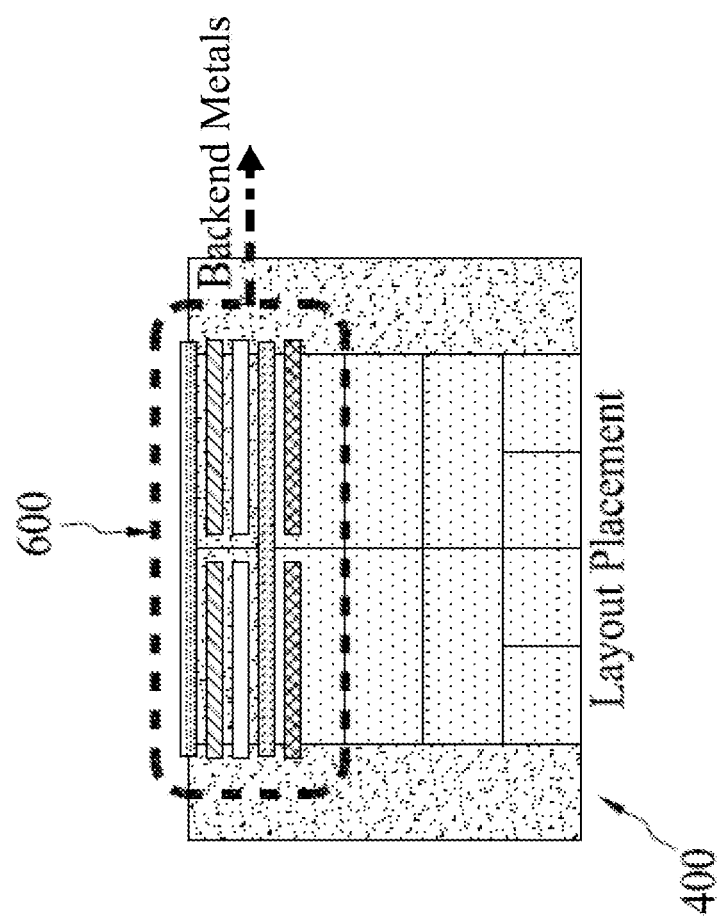
FIGS. 6A, 6B and 6C are schematic illustrations of a layout design of a level shifter circuit, in accordance with some embodiments.
Figure 6B:
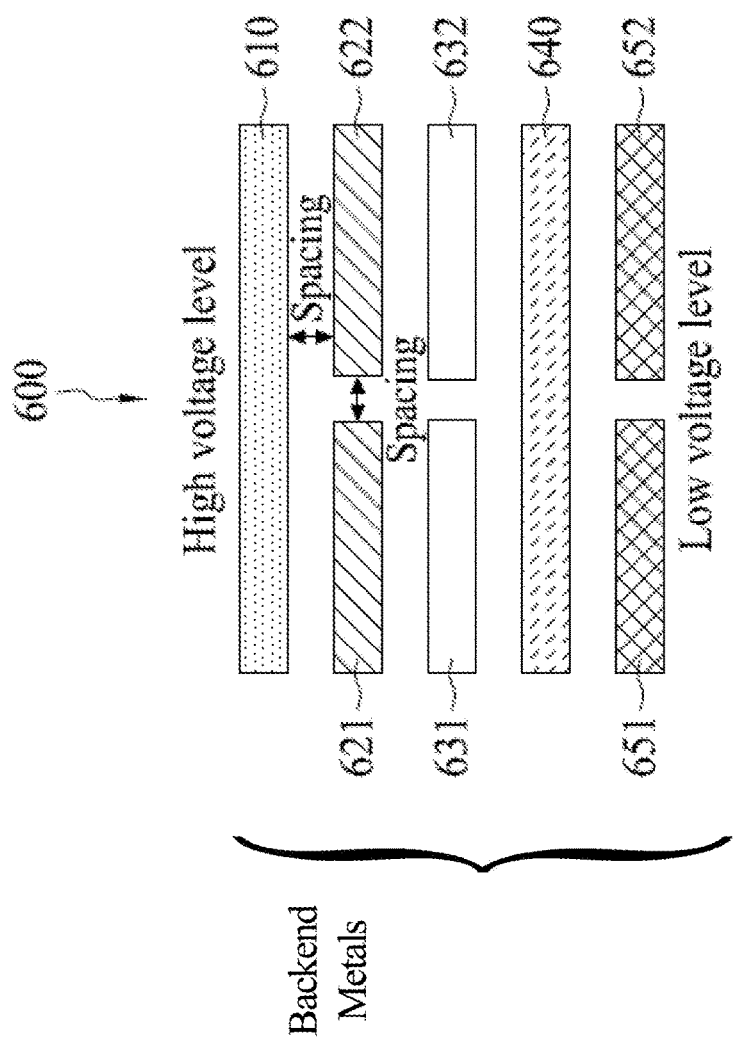
Figure 6C:
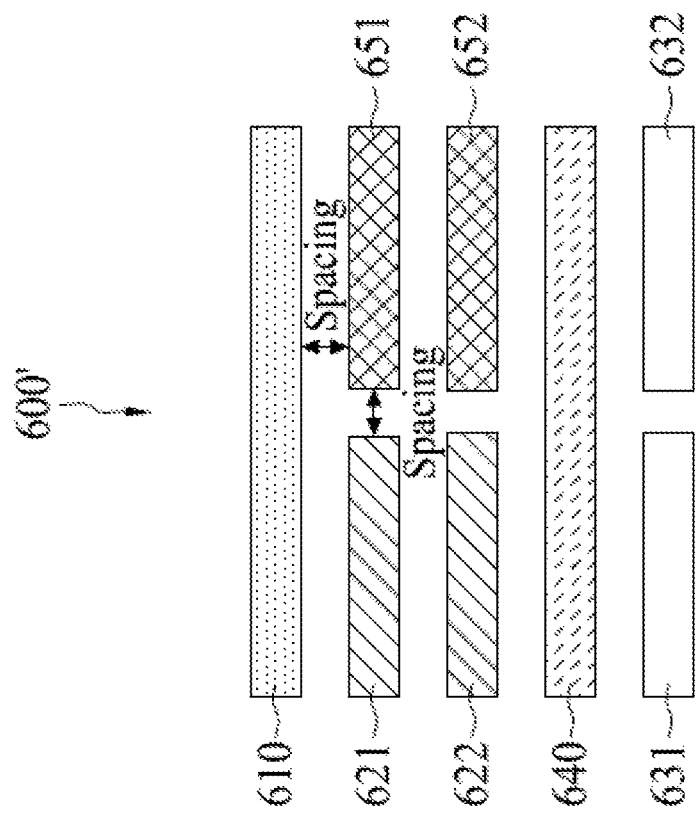

FIGS. 6A, 6B and 6C are schematic illustrations of the layout design of backend metals of the level shifter circuit 100, in accordance with some embodiments. According to some embodiments, the high-V (high voltage) rule in layout design requires a larger spacing when the voltage difference across two metal lines is relatively large. According to some embodiments, metal lines 621 and 622 have similar voltage levels, metal lines 631 and 632 have similar voltage levels, and metal lines 651 and 652 have similar voltage levels. According to some embodiments, the voltages of metal lines, in descending order, are: 610>(621~622)>(631~632)>640>(651~652). According to the high-V rule, in the layout design of the level shifter shown in 600 configuration, adjoining lines 621, 622 have similar voltage levels thereby allowing the spacing between them to be minimized. According to high-V rule, the metal lines are arranged according to their voltage levels from low to high, and metal lines with similar voltage levels are grouped in the same row. In comparison, when metal lines 651 and 652 which have lower voltage levels are placed in the 600' configuration, the voltage difference between 610 and 651 is much larger than the voltage difference between metal lines 651 and 652. As a result, a much larger distance between metal lines 610 and 651 is required compared to the distance between lines 651 and 652. Thus, the configuration 600 shown in FIG. 6 allows for a smaller spacing between metal lines when compared to the configuration of 600'.

Table 1 below is comparison of the performance of the present implementation in FIG. 4 with Broadcom ISSCC'15.

TABLE 1

| Parameters | Broadcom ISSCC'15 | Present Implementation |
| --- | --- | --- |
| Input voltage | 0-1 V | 0-1 V |
| Output voltage | 0.6-1.5 V | 0.6-1.5 V |
| Speed with load (1 fF) | 18 GHz | Pre-sim 33 GHz |
| Rising/falling time | 11.8 ps/10.3 ps | 5.3 ps/3.3 ps |
| Power at 18 GHz (simulation)* | 0.31 mW | 0.10 mW |

As shown in Table 1, the present implementation has the same input voltage and output voltage as Broadcom ISSCC'15, but the present implementation achieves a much higher frequency of 33 GHz, as compared to 18 GHz of the Broadcom ISSCC'15. The rising and falling time of the present implementation are 5.3 ps and 3.3 ps respectively, as compare to 11.8 ps and 10.3 ps of Broadcom ISSCC'15. The power consumption at 18 GHz of the present implantation is 0.10 mW, as compared to 0.31 mW of Broadcom ISSCC'15. The Broadcom ISSCC'15 data are based on: Ali Nazemi, et al., "A 36 Gb/s PAM4 Transmitter Using an 8b 18 GS/s DAC in 28 nm CMOS", ISSCC, February 2015.

Figure 7:
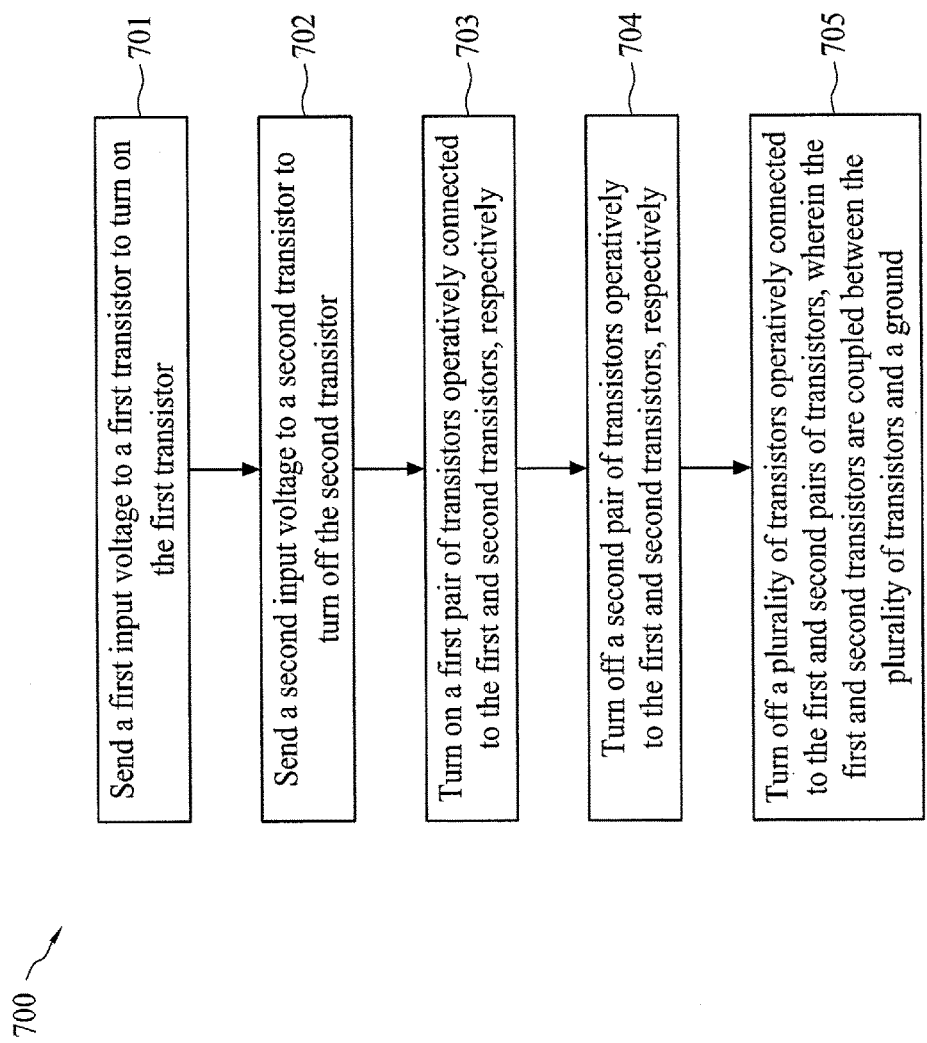
FIG. 7 is a flowchart illustrating a method for high speed level shifting, in accordance with some embodiments.

FIG. 7 is a flowchart illustrating a method 700 for high speed level shifting, in accordance with some embodiments. At operation 701, a first input voltage is sent to a first transistor to turn on the first transistor. A second input voltage is sent at operation 702 to a second transistor to turn off the second transistor. A first pair of transistors are turned on at operation 703. The first pair of transistors are operatively connected to the first and second transistors, respectively. A second pair of transistors are turned off at operation 704. The second pair of transistors are operatively connected to the first and second transistors, respectively. A plurality of transistors are turned off at operation 705. The plurality of transistors are operatively connected to the first and second pairs of transistors. The first and second transistors are coupled between the plurality of transistors and a ground.

In one embodiment, a first voltage is locked to a source power supply voltage of one of the first pair of transistors; and a second voltage is locked to a drain power supply voltage of one of the second pair of transistors. In one example, the first input voltage may be at a logic high level; the second input voltage may be at a logic low level; the source power supply voltage may be at a logic high level; and the drain power supply voltage may be at a logic high level.

In one embodiment, the first pair of transistors are operatively connected to the first and second transistors, through a first capacitor and a second capacitor, respectively. The second pair of transistors are operatively connected to the first and second transistors, through the first capacitor and the second capacitor, respectively. The first capacitor is electrically connected between the first voltage and a gate of the second transistor. The second capacitor is electrically connected between the second voltage and a gate of the first transistor.

According to some embodiments, a level shifter circuit is disclosed. The level shifter circuit includes a latch module with a first plurality of PMOS transistors and a second plurality of NMOS transistors; a MOS module with a third plurality of MOS transistors operatively connected to the latch module; a fourth plurality of transistors operatively connected between the MOS module and the ground; and a fifth plurality of capacitors operatively connected between the latch module and the gates of fourth plurality of transistors.

According to some embodiments, a level shifter circuit implemented on a substrate is disclosed. The level shifter circuit includes a latch module with a first plurality of PMOS transistors and a second plurality of NMOS transistors, the first plurality of PMOS transistors are placed symmetrically to a line of symmetry, the second plurality of NMOS transistors are placed symmetrically to the line of symmetry; a MOS module with a third plurality of MOS transistors operatively connected to the latch module, the third plurality of MOS transistors are placed symmetrically to the line of symmetry; a fourth plurality of transistors operatively connected between the MOS module and the ground, the fourth plurality of NMOS transistors are interleaved for differential pair; and a fifth plurality of capacitors operatively connected between the latch module and the gates of fourth plurality of transistors, the fifth plurality of capacitors are placed symmetrically to the line of symmetry.

According to some embodiments, a method for high-speed level shifting is disclosed. The method includes: sending a first input voltage to a first transistor to turn on the first transistor; sending a second input voltage to a second transistor to turn off the second transistor; turning on a first pair of transistors operatively connected to the first and second transistors, respectively; turning off a second pair of transistors operatively connected to the first and second transistors, respectively; and turning off a plurality of transistors operatively connected to the first and second pairs of transistors, wherein the first and second transistors are coupled between the plurality of transistors and a ground.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A level shifter circuit, comprising:
   a latch with a first plurality of transistors and a second plurality of transistors, wherein drains of the second plurality of transistors are electrically connected to a logic low voltage pin;
   a third plurality of transistors operatively connected to the latch;
   a fourth plurality of transistors operatively connected between the third plurality of transistors and ground; and
   a plurality of capacitors operatively connected between the latch and the gates of the fourth plurality of transistors.

2. The level shifter circuit in claim 1, wherein the first plurality of transistors comprises PMOS transistors and the second plurality of transistors comprise NMOS transistors, and the number of the first plurality of transistors is equal to the number of the second plurality of transistors.

3. The level shifter circuit in claim 2, wherein the first plurality of PMOS transistors are placed within a first guard ring on a surface of a substrate.

4. The level shifter circuit in claim 3, wherein the third plurality of transistors comprise NMOS transistors.

5. The level shifter circuit in claim 4, wherein the fourth plurality of transistors comprise NMOS transistors.

6. The level shifter circuit in claim 5, wherein the second, third and fourth plurality of transistors are placed within a second guard ring on the surface of the substrate.

7. The level shifter circuit in claim 6, wherein the plurality of capacitors are placed outside the first guard ring and the second guard ring.

8. The level shifter circuit in claim 7, wherein the first plurality of PMOS transistors are placed symmetrically to a line of symmetry, the second plurality of NMOS transistors are placed symmetrically to the line of symmetry, the third and the fourth plurality of transistors are placed symmetrically to the line of symmetry, and the plurality of capacitors are placed symmetrically to the line of symmetry.

9. The level shifter circuit in claim 8, wherein the fourth plurality of transistors are placed in a shuffle layout.

10. A level shifter circuit implemented on a substrate, comprising:
    a latch module with a first plurality of PMOS transistors and a second plurality of NMOS transistors, wherein the first plurality of PMOS transistors are placed symmetrically to a line of symmetry of the substrate, wherein the second plurality of NMOS transistors are placed symmetrically to the line of symmetry, and wherein drains of the second plurality of NMOS transistors are electrically connected to a logic low voltage pin;

a MOS module with a third plurality of MOS transistors operatively connected to the latch module, wherein the third plurality of MOS transistors are placed symmetrically to the line of symmetry;

a fourth plurality of transistors operatively connected between the MOS module and the ground, wherein the fourth plurality of NMOS transistors are interleaved; and a plurality of capacitors operatively connected between the latch module and the gates of the fourth plurality of transistors, wherein the plurality of capacitors are placed symmetrically to the line of symmetry.

11. The level shifter circuit implemented on a substrate in claim 10, wherein the first plurality of PMOS transistors are placed within a first guard ring on a surface of the substrate.

12. The level shifter circuit implemented on a substrate in claim 10, wherein the second, the third and the fourth plurality of transistors are placed within a second guard ring on the surface of the substrate.

13. The level shifter circuit implemented on a substrate in claim 12, wherein the plurality of capacitors are placed outside the first guard ring and the second guard ring on the surface of the substrate.

14. The level shifter circuit implemented on a substrate in claim 13, wherein the fourth plurality of transistors are placed in a shuffle layout.

15. The level shifter circuit implemented on a substrate in claim 14, wherein a plurality of backend metals are placed symmetric to the line of symmetry.

16. The level shifter circuit implemented on a substrate in claim 15, wherein the plurality of backend metals are placed according to a high-V rule.

17. A method for high-speed level shifting, the method comprising:

sending a first input voltage to a first transistor to turn on the first transistor;

sending a second input voltage to a second transistor to turn off the second transistor;

turning on a first pair of transistors operatively connected to the first and second transistors, respectively;

turning off a second pair of transistors operatively connected to the first and second transistors, respectively;

turning off a plurality of transistors operatively connected to the first and second pairs of transistors, wherein the first and second transistors are coupled between the plurality of transistors and a ground; and locking a logic low voltage to a source power supply voltage of a first one of the first pair of transistors.

18. The method of claim 17, further comprising:

locking a logic high voltage to a drain power supply voltage of a second one of the first pair of transistors.

19. The method of claim 18, wherein:

the first input voltage is at a logic high level; and the second input voltage is at a logic low level.

20. The method of claim 18, wherein:

the first pair of transistors are operatively connected to the first and second transistors, through a first capacitor and a second capacitor, respectively;

the second pair of transistors are operatively connected to the first and second transistors, through the first capacitor and the second capacitor, respectively;

the first capacitor is electrically connected between the first voltage and a gate of the second transistor; and the second capacitor is electrically connected between the second voltage and a gate of the first transistor.

* * * * *